United States Patent
Sethi et al.

(10) Patent No.: US 12,389,692 B2
(45) Date of Patent: Aug. 12, 2025

(54) PHOTOVOLTAIC MODULE INTERCONNECT JOINTS

(71) Applicant: Maxeon Solar Pte. Ltd., Singapore (SG)

(72) Inventors: Sunny Sethi, San Bruno, CA (US); Michele Guide, San Jose, CA (US); Gabriela Bunea, San Jose, CA (US); Thierry Nguyen, San Francisco, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/370,784

(22) Filed: Sep. 20, 2023

(65) Prior Publication Data

US 2024/0014338 A1 Jan. 11, 2024

Related U.S. Application Data

(60) Division of application No. 16/930,176, filed on Jul. 15, 2020, now Pat. No. 11,799,044, which is a continuation of application No. 14/962,954, filed on Dec. 8, 2015, now Pat. No. 10,770,610.

(51) Int. Cl.
*H10F 19/90* (2025.01)

(52) U.S. Cl.
CPC ......... *H10F 19/906* (2025.01); *H10F 19/902* (2025.01); *Y02E 10/50* (2013.01)

(58) Field of Classification Search
CPC .............. H01L 31/05–0516; H01L 31/022433
See application file for complete search history.

(56) References Cited

U.S. PATENT DOCUMENTS

| | | | |
|---|---|---|---|
| 4,617,420 | A | 10/1986 | Dilts et al. |
| 5,679,176 | A | 10/1997 | Tsuzuki et al. |
| 6,303,853 | B1 | 10/2001 | Fraas et al. |
| 7,388,146 | B2 | 6/2008 | Fraas et al. |
| 2002/0062990 | A1 | 5/2002 | Kikuchi et al. |

(Continued)

FOREIGN PATENT DOCUMENTS

| | | |
|---|---|---|
| CN | 104919597 | 9/2015 |
| EP | 2843710 | 3/2015 |

(Continued)

OTHER PUBLICATIONS

S. Mandal, "Suitability assessment of ehthylene-vinyl-acetate (EVA) as a material for dynamic photoelastic coating," AZojomo (Year: 2012).

ASTM, "Standard Test Method for Young's Modulus, Tangent Modulus, and Chord Modulus" (retrieved from https://compass.astm.org/ERIT/html_annot.cgi?E111+17 on Jun. 5, 2019). (Year: 2017).

(Continued)

*Primary Examiner* — Ryan S Cannon
(74) *Attorney, Agent, or Firm* — Schwabe, Williamson & Wyatt, P.C.

(57) ABSTRACT

Photovoltaic (PV) cells that can be interconnected with improved interconnect joints to form PV cell strings and PV modules. The improved interconnect joints comprise at least two types of adhesive bonding regions to maximize both electrical conductivity and mechanical strength of interconnect joints coupling terminals of PV cells. The disclosed approaches to PV cell interconnection provide greater manufacturing rates and higher quality PV cell strings and PV modules.

4 Claims, 9 Drawing Sheets

(56) References Cited

U.S. PATENT DOCUMENTS

| | | | |
|---|---|---|---|
| 2007/0186968 A1* | 8/2007 | Nakauchi | H01L 31/1876 |
| | | | 136/244 |
| 2009/0038675 A1 | 2/2009 | Tsunomura et al. | |
| 2010/0129122 A1 | 5/2010 | Ciaschi | |
| 2011/0132426 A1 | 6/2011 | Kang et al. | |
| 2012/0080068 A1 | 4/2012 | Bae et al. | |
| 2012/0125391 A1 | 5/2012 | Pinarbasi et al. | |
| 2012/0312358 A1 | 12/2012 | Yamashita et al. | |
| 2012/0318319 A1 | 12/2012 | Pinarbasi et al. | |
| 2012/0325282 A1 | 12/2012 | Snow et al. | |
| 2013/0048066 A1 | 2/2013 | Hegedus | |
| 2013/0152996 A1 | 6/2013 | DeGroot et al. | |
| 2013/0206213 A1 | 8/2013 | He et al. | |
| 2014/0076382 A1 | 3/2014 | Dafnoitis | |
| 2014/0102508 A1 | 4/2014 | Ishii | |
| 2014/0124014 A1 | 5/2014 | Morad et al. | |
| 2014/0213013 A1 | 7/2014 | Britt et al. | |
| 2015/0349172 A1 | 12/2015 | Morad et al. | |
| 2017/0125619 A1 | 5/2017 | Nakano et al. | |

FOREIGN PATENT DOCUMENTS

| | | |
|---|---|---|
| JP | 2009-130193 | 6/2009 |
| JP | 2013-030655 | 2/2013 |
| WO | WO 2015-183827 | 12/2015 |
| WO | WO 2015-152020 | 4/2017 |

OTHER PUBLICATIONS

International Search Report and Written Opinion from PCT/US2016/064498 mailed Mar. 8, 2017, 13 pgs.

International Preliminary Report on Patentability from PCT/US2016/064498 mailed Jun. 12, 2018, 10 pgs.

First Action Interview—Pre-Interview Communication from U.S. Appl. No. 14/962,954 dated Jul. 3, 2017, 16 pgs.

First Action Interview—Office Action Summary from U.S. Appl. No. 14/962,954 dated Nov. 6, 2017, 10 pgs.

Final Office Action from U.S. Appl. No. 14/962,954 dated May 4, 2018, 22 pgs.

Non Final Office Action from U.S. Appl. No. 14/962,954 dated Dec. 28, 2018, 19 pgs.

Final Office Action from U.S. Appl. No. 14/962,954 dated Jun. 10, 2019, 17 pgs.

Non Final Office Action from U.S. Appl. No. 14/962,954 dated Feb. 19, 2020, 15 pgs.

First Office Action from Chinese Patent Application No. 2016800687533 dated Jun. 3, 2021, 9 pgs.

Final Office Action from U.S. Appl. No. 16/930,176 dated May 11, 2022, 13 pgs.

First Action Interview—Office Action Summary from U.S. Appl. No. 16/930,176 dated Oct. 5, 2021, 5 pgs.

Non Final Office Action from U.S. Appl. No. 16/930,176 dated Feb. 23, 2023, 10 pgs.

First Action Interview—Pre-Interview Communication from U.S. Appl. No. 16/930,176 dated Jun. 29, 2021, 9 pgs.

* cited by examiner

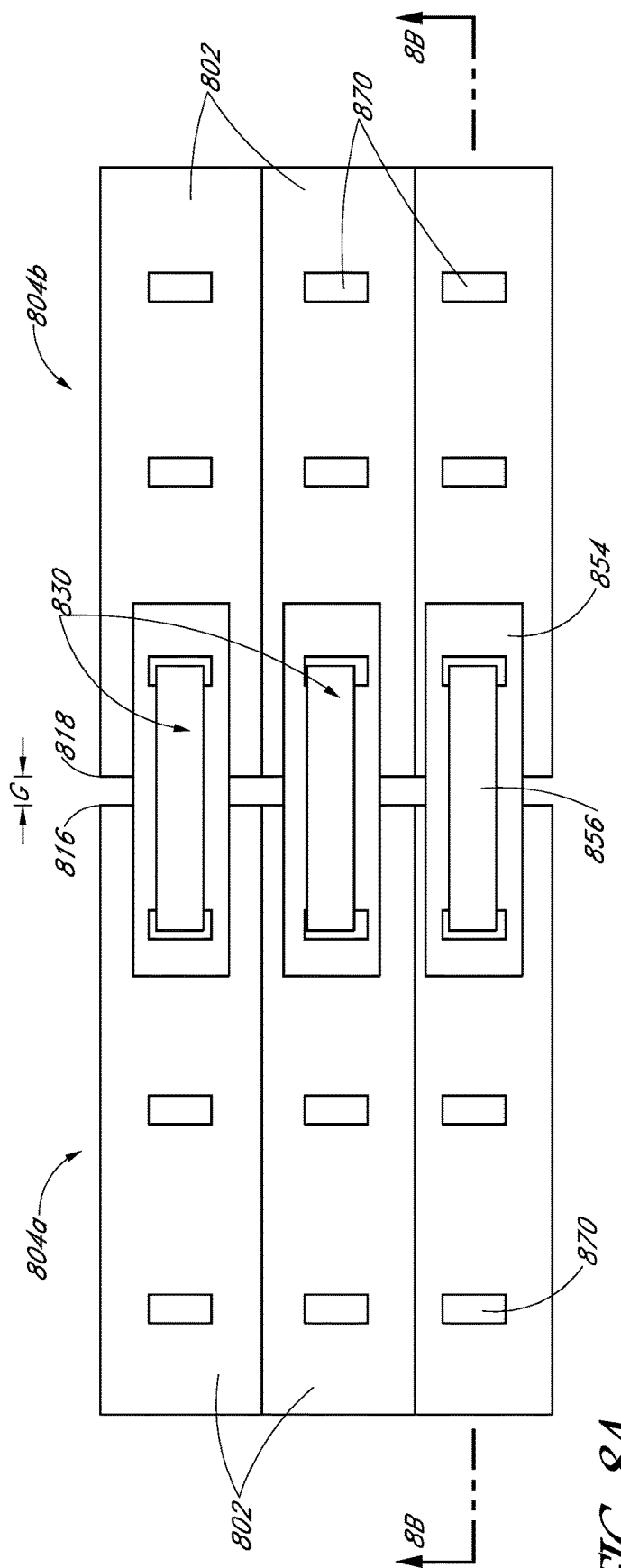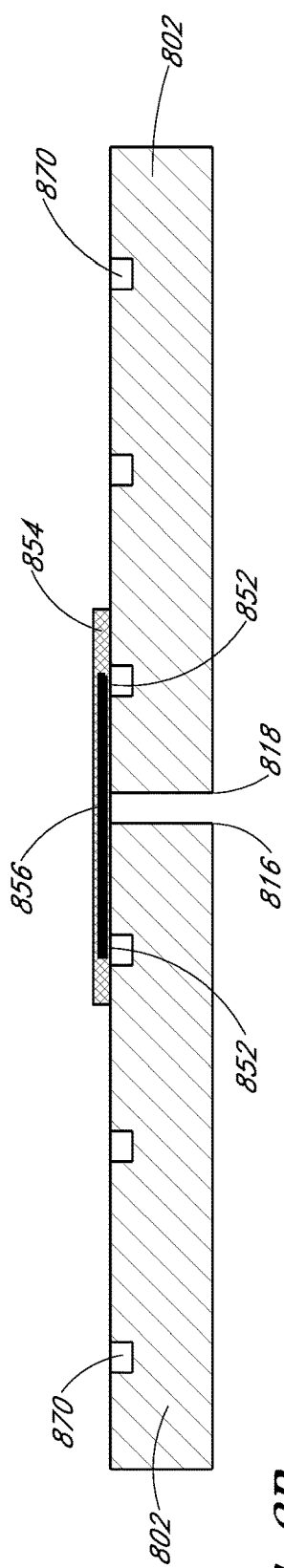
FIG. 8A
FIG. 8B

PHOTOVOLTAIC MODULE INTERCONNECT JOINTS

CROSS-REFERENCE TO RELATED APPLICATIONS

This application is a Divisional of U.S. patent application Ser. No. 16/930,176, filed on Jul. 15, 2020, which is a Continuation of U.S. patent application Ser. No. 14/962,954, filed on Dec. 8, 2015, now U.S. Pat. No. 10,770,610, issued on Sep. 8, 2020, the entire contents of which are hereby incorporated by reference herein.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the solar cell to an external circuit. When PV cells are combined in an array such as a PV module, the electrical energy collect from all of the PV cells can be combined in series and parallel arrangements to provide power with a certain voltage and current. Solar cells can be interconnected together in series via interconnects to provide a string of solar cells, which in turn can be connected in series to form a solar module.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are not drawn to scale.

FIGS. 8A and 8B illustrate an interconnect joint according to an embodiment;

DETAILED DESCRIPTION

Figure 1:
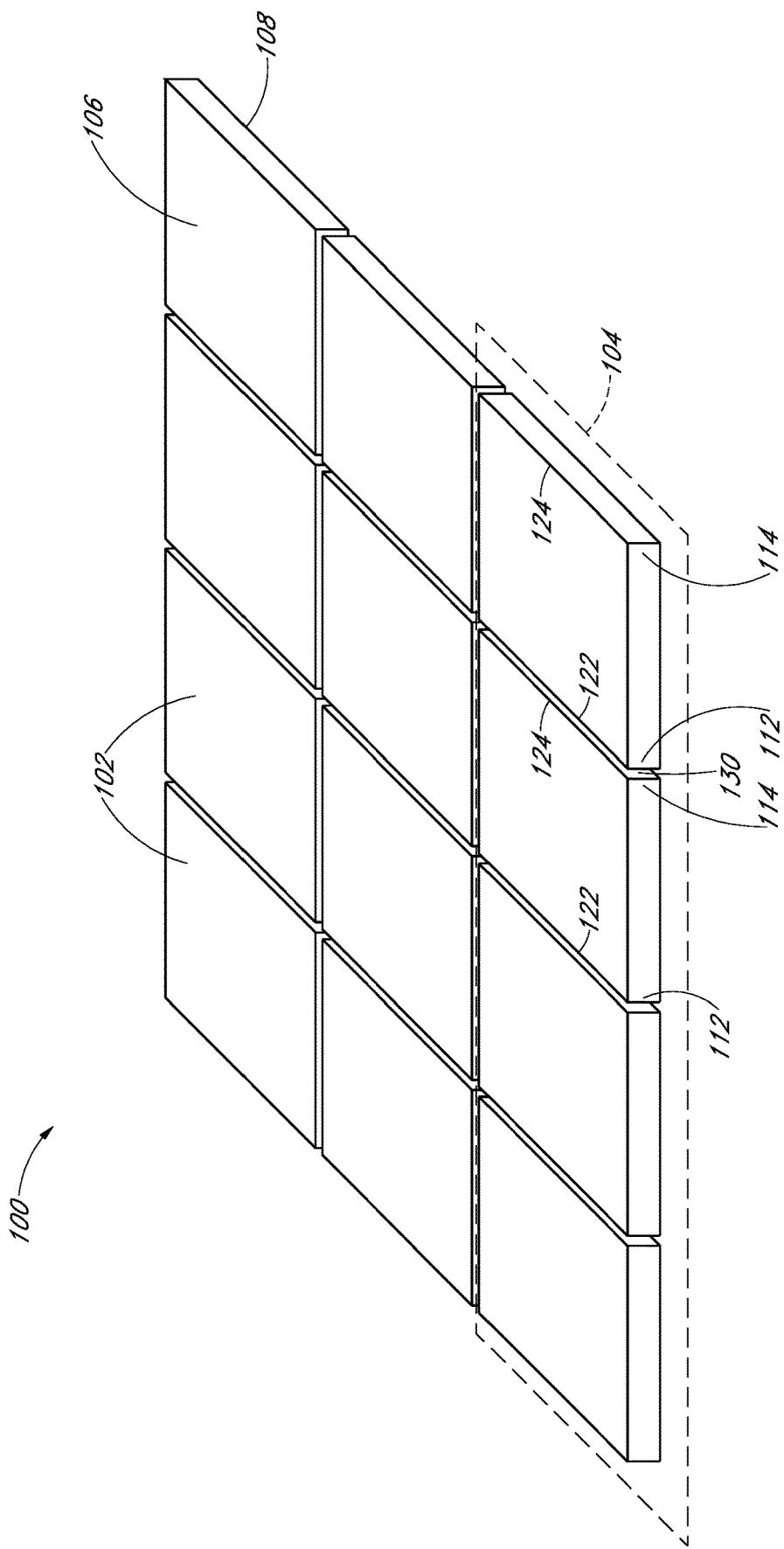
FIG. 1 illustrates a top-down view of a photovoltaic (PV) module according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Terminology—The following paragraphs provide definitions and/or context for terms found in this disclosure (including the appended claims):

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

This term "comprising" is open-ended. As used in the appended claims, this term does not foreclose additional structure or steps.

Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

As used herein, the terms "first," "second," etc. are used as labels for nouns that they precede, and do not imply any type of ordering (e.g., spatial, temporal, logical, etc.). For example, reference to a "first" bonding region does not necessarily imply that this bonding region is the first bonding region in a sequence; instead the term "first" is used to differentiate this bonding region from another bonding region (e.g., a "second" bonding region).

The terms "a" and "an" are defined as one or more unless this disclosure explicitly requires otherwise.

The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

As used herein, "inhibit" is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within a percentage of" what is specified, where the percentage includes 0.1, 1, 5, and 10 percent.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As used herein, "regions" can be used to describe discrete areas, volumes, divisions or locations of an object or material having definable characteristics but not always fixed boundaries.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present invention. The feature or features of one embodiment can be applied to other embodiments, even though not described or illustrated, unless expressly prohibited by this disclosure or the nature of the embodiments.

This specification describes example photovoltaic (PV) cells that can be interconnected with the disclosed interconnect joints to form PV cell strings and PV modules. The specification then includes a description of example methods for forming the interconnect structures. The disclosed interconnect joints comprise at least two types of adhesive bonding regions to maximize both electrical conductivity and mechanical strength of interconnect joints coupling terminals of PV cells. The adhesive bonding regions can comprise different adhesive materials and can be arranged in predetermined configurations to maximize both electrical conductivity and mechanical strength of interconnect joints. In one embodiment, bonding regions of the first type are electrically conductive and bonding regions of the second type are electrically non-conductive and provide mechanical strength to interconnect joints. The disclosed approaches to PV cell interconnection provide greater manufacturing rates and higher quality PV cell strings and PV modules. Various examples are provided throughout.

Referring to the embodiment depicted in FIG. 1, a PV module 100 comprises a plurality of PV cells 102. The plurality of PV cells 102 are connected to form PV cell strings 104. Each PV cell has a first side 106 and a second side 108 which is opposite the first side 106. In one embodiment, the first side 106, or front side, can face the sun to collect solar radiation and the second side 108, or back side, can face away from the sun during normal operation of the PV module 100. In other embodiments, the second side 108 can also collect sunlight. In some embodiments, PV cells are bifacial and diffuse light can be collected from front and back sides.

In an embodiment, each PV cell comprises at least two opposite peripheral edges. In the embodiment depicted in FIG. 1, PV cell 102 has a first peripheral edge 112 opposite a second peripheral edge 114. The PV cells 102 further comprise a first terminal 122 along the first edge 112 and a second terminal 124 along the second edge 114. The first terminals 122 are coupled to the second terminals 124 to form interconnect joints 130.

In some embodiments, a PV module can comprise PV cells connected in a shingled arrangement such that a first edge portion, or first terminal, of a first PV cell overlaps a second edge portion, or second terminal, of a second PV cell. In a shingled PV module, a portion of a first side of a first PV cell faces a portion of a second side of a second PV cell.

FIG. 1 illustrates a PV module 100 according to an embodiment. Unless otherwise designated, the components of FIG. 2-10 are similar to those described above with reference to FIG. 1, except that they have been incremented sequentially by 100.

Figure 2:
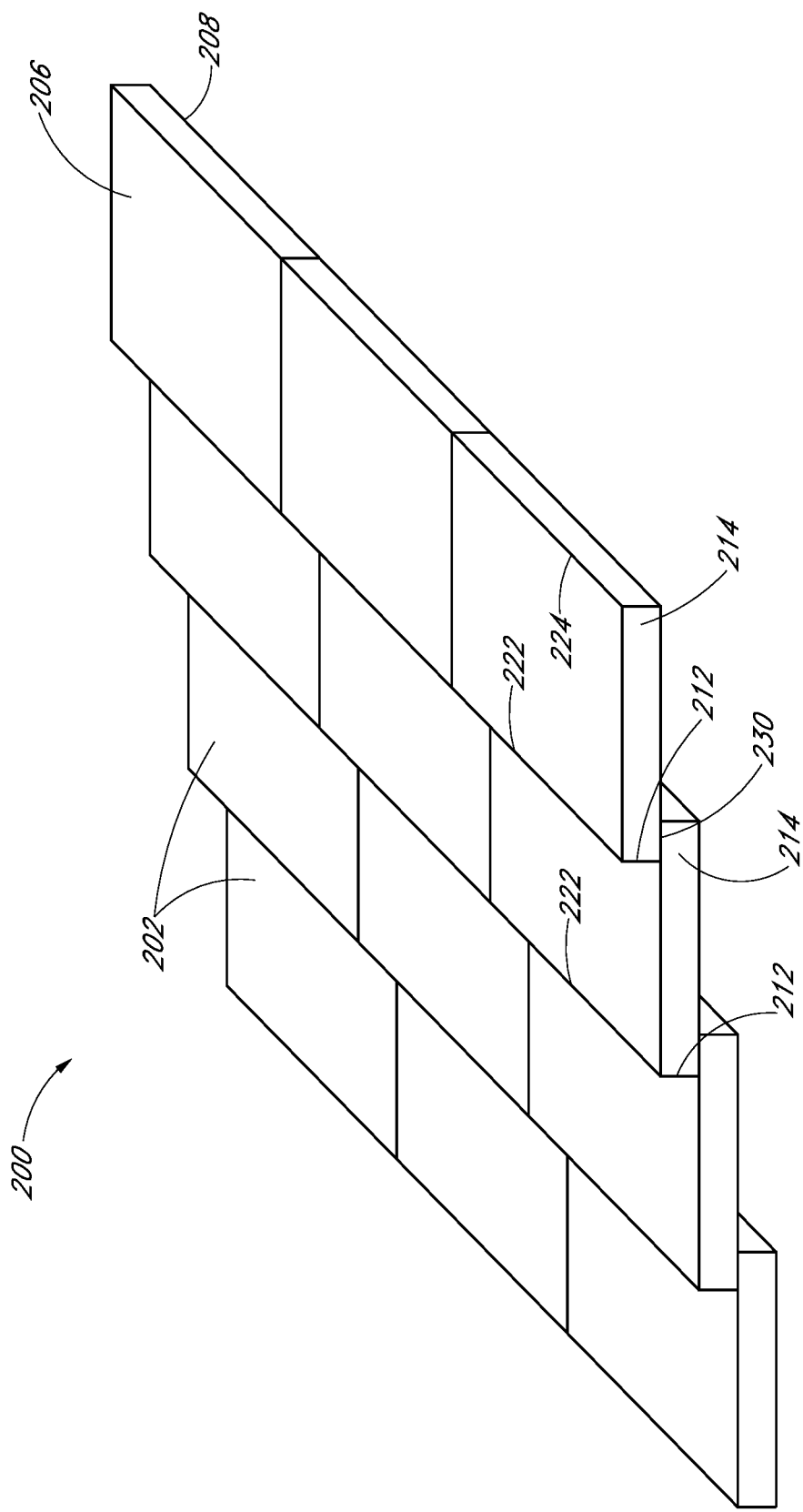
FIG. 2 illustrates a top-down view of a PV module according to some embodiments.

In the embodiment depicted in FIG. 2, a PV module 200 comprises a plurality of PV cells 202 configured into PV cell string 204. Each PV cell 202 has a first side 206 and a second side 208 which is opposite the first side 206. Each PV cell 202 has a first edge 212 opposite a second edge 214. Furthermore, each PV cell 202 comprises a first terminal 222 along peripheral edge 212 and second terminal 224 along peripheral edge 214. The PV cells 202 are connected such that each first terminal 222 overlaps an adjacent second terminal 224 at interconnect joint 230. Furthermore, shingled PV cells 202 are connected such that first side 206 faces second side 208 of an adjacent PV cell 202 at interconnect joint 230.

Figure 3:
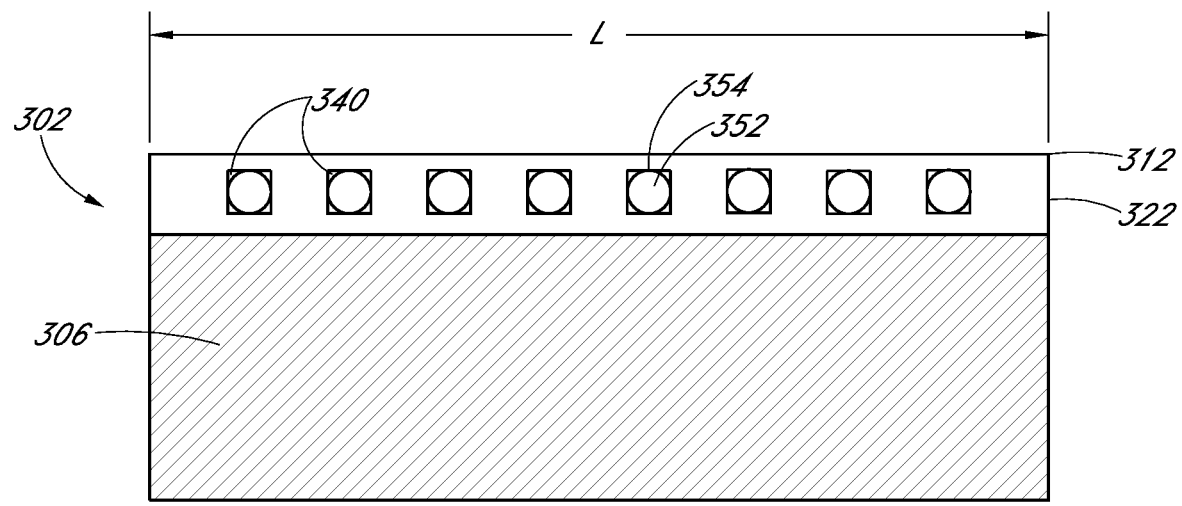
FIG. 3 illustrates a PV cell comprising concentric adhesive regions according to an embodiment.

The illustration of FIG. 3 depicts a top-down view of PV cell 302 comprising a first terminal 322 at peripheral edge 312 on first side 306 of PV cell 302. The first terminal 322 comprises a plurality of contact pads 340 extending along an interconnect bond line having a length L. The "interconnect bond line" is a term used herein to refer to a region between terminals of adjacent cells which comprises adhesive bonding regions. The interconnect bond line can be a longitudinal extent of an interconnect joint along one longitudinal direction.

Contact pads can be formed of an electrically conductive material, for example an elemental metal or metal alloy (e.g. aluminum, copper, nickel, silver, gold). In some embodiments, the contact pad is substantially planar. In other embodiments, the contact pad can comprise a coarse or roughened surface. In the illustration of FIG. 3, eight contact pads 340 are depicted, however any suitable number of contact pads can be provided; for example in some embodiments a single contact pad is provided. The contact pads 340 depicted in FIG. 3 are substantially rectangular, however in other embodiments, contact pads can be provided in any desired shape. For example contact pads can be circular, oval, or square, stars, triangular, irregularly shaped, pointed, and so on.

In an embodiment, a terminal of a PV cell comprises first and second bonding regions, wherein the first bonding region comprises a first adhesive material and the second bonding region comprises a second adhesive material which is different from the first adhesive material. Bonding regions comprising the first adhesive material can also be described as bonding regions of the first type. Likewise, bonding regions comprising the second adhesive material can be described as bonding regions of the second type.

In the embodiment depicted in FIG. 3, the first terminal 322 comprises first bonding regions 352 and second bonding regions 354. In the illustrated embodiment, both the first and the second adhesive bonding regions are concentrically arranged such that the second bonding regions 354 substantially surround the first bonding regions 352. In FIG. 3, both the first and second bonding regions 352, 354 are in contact with contact pads 340. In other embodiments, first bonding regions can be in contact with a contact pad and second bonding regions can be outside a perimeter of the contact pad so as not to be in physical contact with the contact pad. In FIG. 3, first and second bonding regions 352, 354 do not entirely cover contact pads 340. However in other embodiments, first and/or second bonding regions can substantially entirely cover a contact pad.

In an embodiment, the first adhesive material is an electrically-conductive adhesive comprising conductive particles in a matrix, or resin. The conductive particles can be of any suitable electrically conductive material and geometry. In some embodiments, the conductive particles can be a single type of electrically conductive material or a mixture of electrically conductive materials. Furthermore, the first adhesive material can comprise a mixture of electrically conductive particles and non-electrically conductive particles. For example, carbons such as carbon black, graphite, graphene or carbon nanotubes can be employed. As another example, the first adhesive can comprise metal particles such as silver, nickel, tin, zinc, copper, gold, aluminum, iron, titanium, palladium, platinum and alloys thereof. In an embodiment, the first adhesive material comprises a resin or matrix selected from the group of epoxies, acrylates, silicones, imides, bismalemide, their derivatives and copolymers thereof. In some embodiments, the matrix can comprise a mixture or blend of resins.

In one embodiment, the second adhesive material is selected from the group containing epoxies, silicones, vinyl acetates, polyolefins, polyimides, acrylates, polyurethanes, cyanoacrylates, phenolics, their derivatives and any combination thereof. In some embodiments, the second bonding region can be an adhesive tape comprising a backing materials coated with the second adhesive material. For example, backing materials can include paper, polymeric film, cloth, and/or metal foil.

Figure 4:
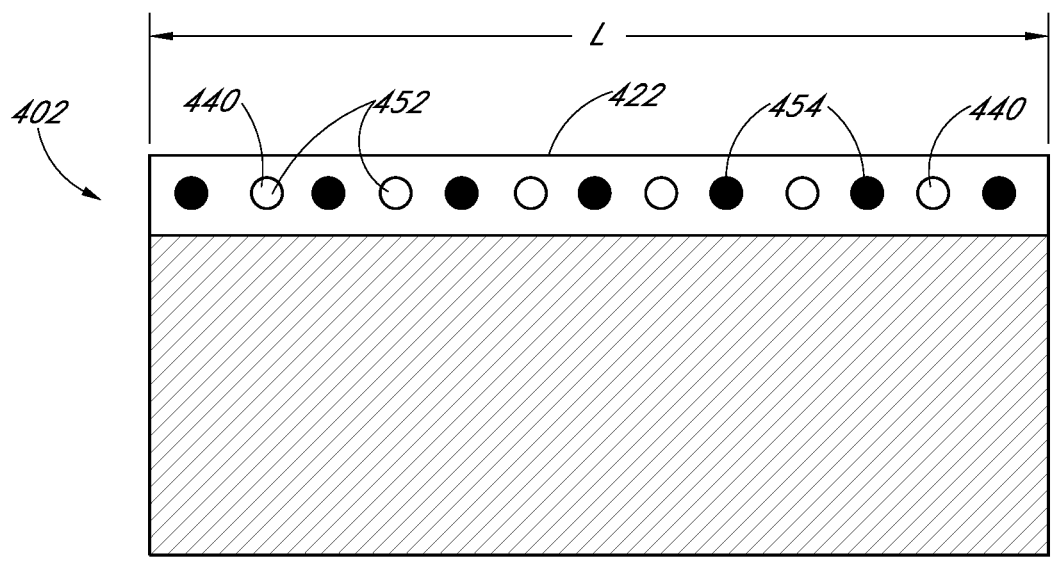
FIG. 4 illustrates a PV cell comprising alternating adhesive regions according to an embodiment.

As depicted in FIG. 4, a first terminal 422 comprises bonding regions of the first type 452 and bonding regions of the second type 454 provided in an alternating manner along an interconnect bond line having a length L. In the illustrated embodiment of FIG. 4, bonding regions of the first and second type 452, 454 are provided as substantially circular regions, however any desired shape bonding region shape can be formed according to the design of terminal 422 of PV cell 402 and/or other manufacturing considerations. Furthermore, bonding regions of the first and second type 452, 454 can be discrete, or isolated regions as depicted in FIG. 4. In other embodiments, adhesive bonding regions can be in physical contact, or can be abutting adhesive regions. In FIG. 4, bonding regions of the first type 452 are substantially aligned with adjacent bonding regions of the second type 454; however, in other embodiments, adjacent bonding regions can be staggered, or offset from each other. In FIG. 4, single bonding regions of the first type 452 alternate with single bonding regions of the second type 454 such that bonding regions of the same type are not directly adjacent. In other embodiments, bonding regions of the same type can be directly adjacent, for example two bonding regions of the first type can alternate with two bonding regions of the second type. In FIG. 4, first bonding regions 452 substantially entirely cover contact pads generally depicted at 440 for electrical connection.

Figure 5:
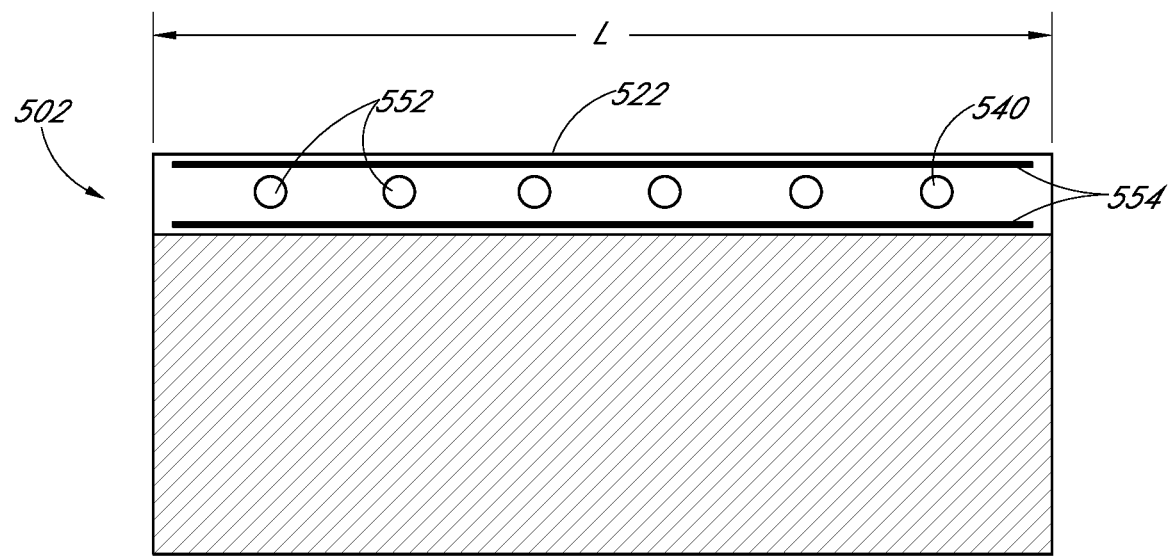
FIG. 5 illustrates a PV cell comprising central and peripheral adhesive regions according to an embodiment.

FIG. 5 depicts adhesive bonding regions of the first type 552 arranged centrally along interconnect bond line length L. Adhesive bonding regions of the second type 554 border central adhesive bonding regions of the first type 552. As depicted in FIG. 5, adhesive bonding regions of the second type 552 can be provided as substantially continuous lines. However in other embodiments, adhesive bonding regions can be provided as dashed lines, or a plurality of discrete regions along interconnect bond line length L.

Figure 6:
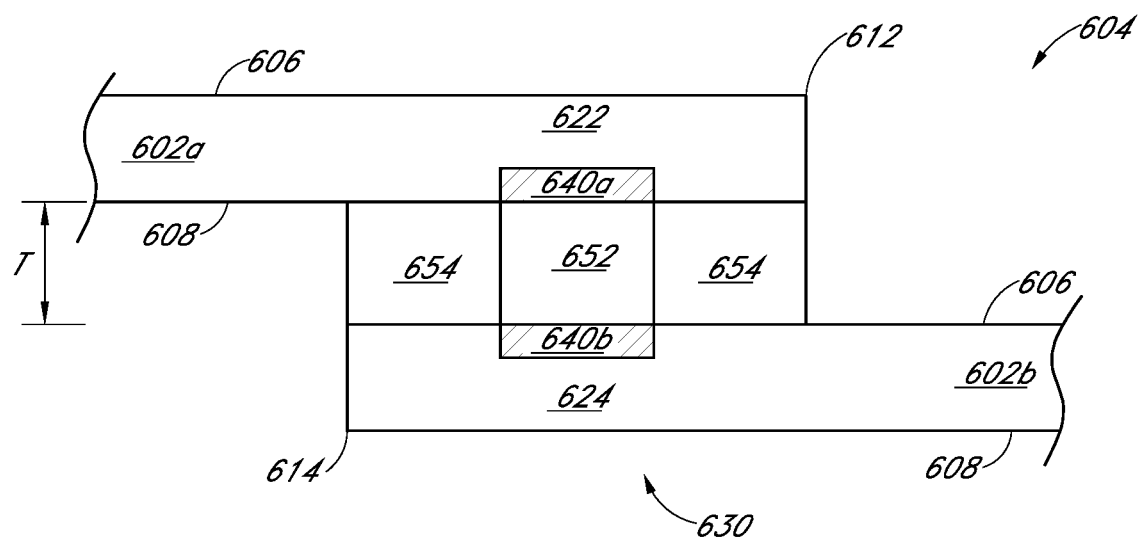
FIG. 6 illustrates a cross-sectional view of an interconnect joint according to an embodiment.

FIG. 6 depicts a cross-sectional view of a portion of a shingled PV module cell string 604 comprising PV cells individually labeled 602a and 602b. PV cells 602a, 602b each have first sides 606 and second sides 608. The first side 606 of PV cell 602b faces the second side 608 of PV cell 602b. PV cell 602a has a first terminal 622 along peripheral edge 612 and PV cell 602b has a second terminal 624 along peripheral edge 614. The first terminal 622 of PV cell 602a partially overlaps the second terminal 624 of PV cell 602b to form interconnect joint 630 aligning the terminals 622, 624. The interconnect joint 630 defines an interconnect bond line having a bond line thickness T. The interconnect joint 630 comprises a central adhesive bonding region of the first type 652 substantially surrounded by adhesive bonding regions of the second type 654. In the example of FIG. 6, the first bonding region 652 contacts both contact pad 640a of PV cell 602a and contact pad 640b of PV cell 602b. In other embodiments, bonding regions of the first and second type can both be in physical contact with contact pads of adjacent PV cells.

Figure 7A:
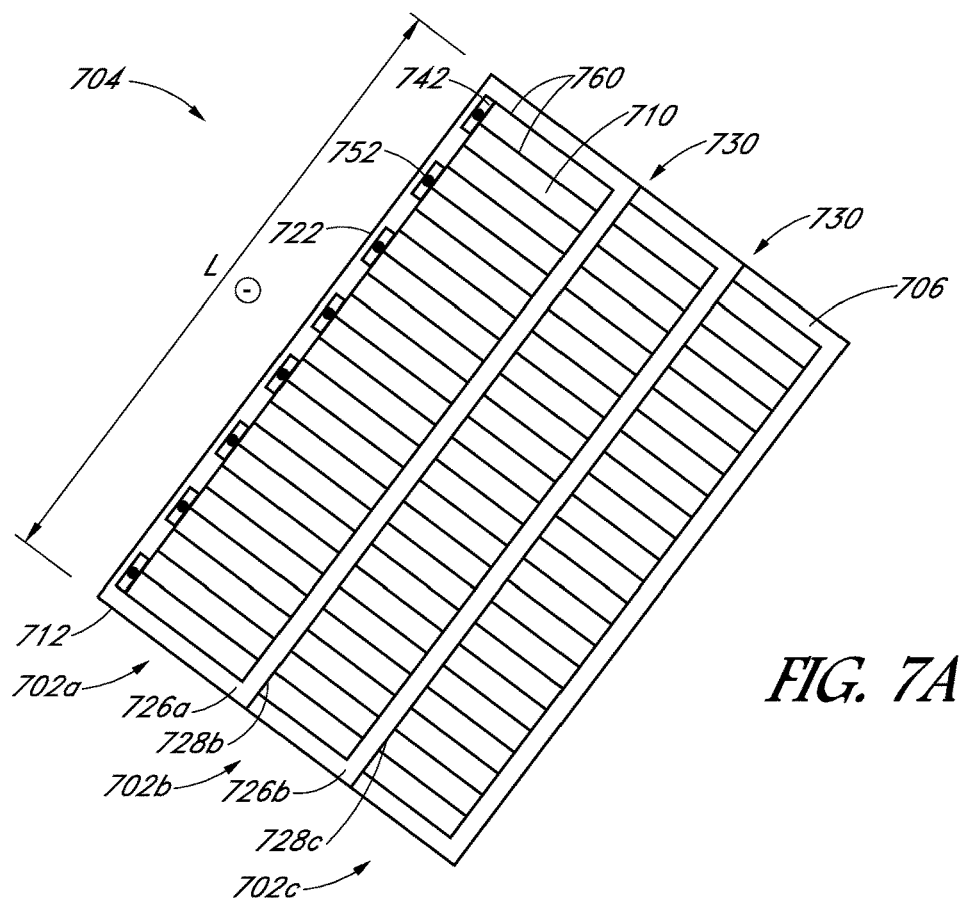
FIGS. 7A and 7B illustrate a portion of a PV cell string according to an embodiment.
Figure 7B:
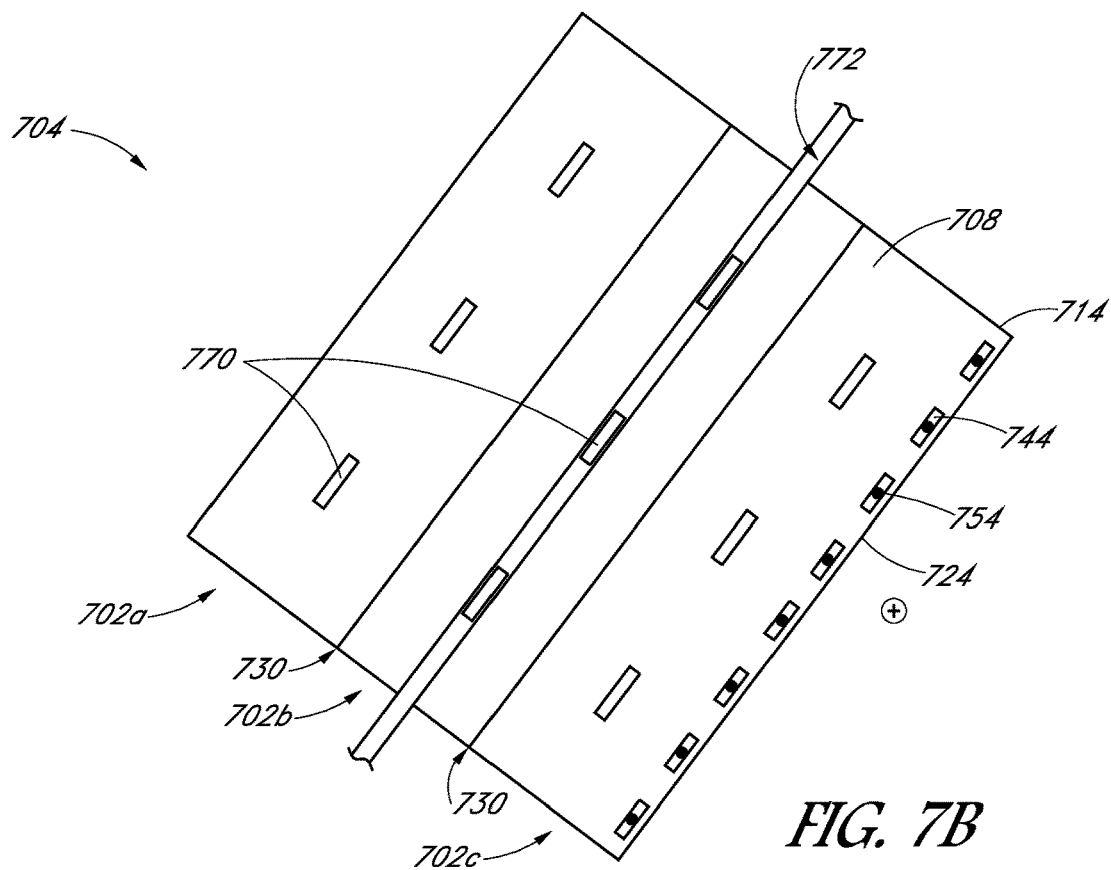

FIG. 7A depicts a first side 706 of a portion of a shingled PV cell string 704 and FIG. 7B depicts a second side 708 of the shingled PV cell string 704, wherein the second side 708 is opposite the first side 706. The first side 706 can be a front side in that it faces the sun to collect solar radiation during normal operation and the second side 708 can be a back side of PV cell string 704. As viewed from the front side 706 depicted in FIG. 7A, PV cell string 704 comprises three PV cells 702a-c connected in a shingled relationship such that edge portion 726a of PV cell 702a is on top of edge portion 728b of adjacent PV cell 702b and edge portion 726b of PV cell 702b is on top of edge portion 728c of adjacent PV cell 702c. Peripheral edges 712 of cells 702a-c each comprise contact pads 742 along bond line length L, however only contact pads 742 of cell 702a are visible in FIG. 7A due to the shingled configuration. Similarly, peripheral edges 714 of cells 702a-c comprise contact pads 744, however only contact pads 744 of cell 702c are visible in the illustration of FIG. 7B. Bonding regions of the first type 752, 754 are substantially centered on each contact pad 742, 744. As depicted in FIGS. 7A and 7B, the bonding regions of the first type 752, 754 bond terminals 722, 724 of PV cells 702a-c to form a plurality of interconnect joints generally depicted at 730.

Contacts pads, and/or bus bars, can be electrically connected to p-doped and n-doped regions of a semiconductor substrate of a PV cell (e.g. semiconductor substrate 710 of PV cell 702a). For PV cells comprising contact pads, p-doped and n-doped regions in the semiconductor substrate can be connected to conductive conduits, or fingers, which terminate into contact pads to direct an electrical current from a PV cell to an external circuit.

On the first side 706 depicted in FIG. 7A, n-doped regions of PV cells 702a-c can connect to conductive conduits, or fingers 760 which terminate into contact pads 742 of a negative terminal 722. On the second side 708 depicted in FIG. 7B, p-doped regions of PV cells 702a-c can connect to contact pads 744 of a positive terminal 724. As depicted, conductive conduits are not visible on second side 708, however in other embodiments, conductive conduits, or fingers, can be visible at the surface of a second side of a PV cell.

In some embodiments, PV cells can comprise pad-less terminals. For pad-less PV cells, p-doped and n-doped regions in the semiconductor substrate do not terminate into contact pads. For example, conductive conduits, or fingers, can be simply terminate at a peripheral edge of a pad-less PV cell.

In an embodiment, the second bonding region, or bonding region of the second type, comprises an encapsulant material. Encapsulants can be cured or laminated to encapsulate PV cells, and to bond PV cells between a backsheet and a substantially transparent cover (e.g. glass) to form a PV laminate. The resulting protective package, or laminate, can then optionally mounted with a frame to produce a PV module. Encapsulants for PV cells can provide electrical insulation, reduce moisture ingress, and protect components of a PV module from mechanical stress and/or corrosion. Encapsulant materials can be selected from the group of ethylene vinyl acetate (EVA), polyolefins, silicones, their derivatives or combinations thereof. In some embodiments, bonding regions of the first type can comprise an electrically conductive adhesive applied at terminals of a plurality of PV cells to form a PV cell string. The PV cell string can then be encapsulated by an encapsulant material such that the encapsulant is a bonding region of the second type. For example, the PV cell string 704 of FIGS. 7A and 7B can comprise bonding regions of the first type 752, 754 connecting PV cells 702a-c at interconnect joints 730, wherein bonding regions of the first type 752, 754 comprise an electrically conductive adhesive. A bonding region of the second type can be an encapsulant material encapsulating, or surrounding interconnect joints 730 of PV cell string 704.

In the example of FIG. 7B, the second side 708 comprises bypass contact pads 770 at each cell 702a-c. A bypass ribbon 772 connects bypass contact pads 770 of cell 702b. Bypass contact pads and bypass ribbons can be formed of an electrically conductive material, for example an elemental metal or metal alloy (e.g. aluminum, copper, nickel, silver, gold). Bypass contact pads can be connected by bypass bus bars, or ribbons. Bypass ribbons can bypass terminals of PV cells and/or bypass PV cells which may be inoperative or performing poorly (e.g. shaded from the sun, comprising corroded electrical contacts). As depicted in FIG. 7B, bypass ribbon 772 connects bypass contact pads 770 of cell 702b. In one embodiment, bypass ribbon 772 can partition cell 702a from 702c. Bypass contact pads and bypass ribbons can be provided in any desired configuration to bypass terminals and/or partition a PV module into a plurality of PV cell sub-strings to prevent "hot spots" and/or direct a maximum amount of electrical current from the PV module to an external circuit.

FIG. 8A depicts a view of a second, or back side of two PV cell strings 804a-b and FIG. 8B depicts a cross-sectional view of the PV cell strings 804a-b. In the embodiment depicted in FIGS. 8A and 8B, each PV cell string 804a-b comprises a plurality of PV cells 802. Each PV cell 802 comprises three bypass contact pads 870. Bypass contact pads 870 at peripheral edge 816 of PV cell string 804a are connected to bypass contact pads 870 at peripheral edge 818 of PV cell 804b by interconnect joints 830. Interconnect joints 830 comprise bonding regions of the first type 852 on bypass contact pads 870. Bonding regions of the first type 852 are connected by a conductive conduit 856. In the example of FIGS. 8A and 8B, between the first of said plurality of adhesive bonding regions and the second of said plurality of adhesive bonding regions. In the embodiment depicted in FIGS. 8A and 8B, both conductive conduit 856 and the second adhesive region 854 span a gap G between PV strings 804a-b. However in other embodiments, second adhesive regions can be isolated at each PV cell string 804a-b such that only the conductive conduit 856 spans gap G.

The conductive conduit 856 can be an electrically conductive element, for example a metallic wire, sheet or ribbon (e.g. copper, aluminum, copper, nickel, silver, gold). An adhesive bonding region of the second type 854 can be an adhesive tape comprising a backing material (e.g. paper, polymeric material) coated with non-electrically conductive second adhesive material.

The type of first and second adhesive materials can maximize both electrical conductivity and mechanical strength of interconnect joints. In addition, the first and second bonding regions can be arranged to optimize the electrical conductivity and mechanical strength of interconnect joints coupling terminals of PV cells. In an embodiment, the first adhesive material is different from the second adhesive material. In another embodiment, the first adhesive material maximizes the electrical conductivity of an interconnect joint between PV cells, whereas the second adhesive material maximizes the mechanical strength of an interconnect joint between PV cells. For example, the electrical resistance of the first adhesive material is less than $10^{-2}$ ohms-cm. As another example, the Young's modulus of the second adhesive material is greater than 5 MPa.

Figure 9:
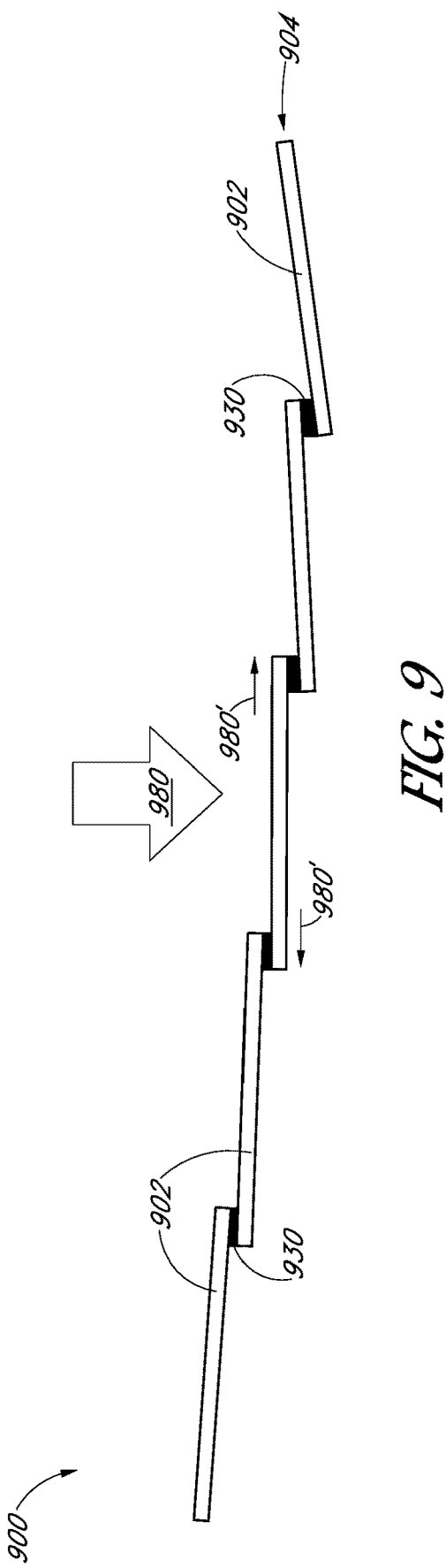
FIG. 9 illustrates a PV cell string according to an embodiment.

PV strings and/or modules can encounter stresses during various manufacturing processes, installation and/or operation in adverse weather conditions. For example, PV strings and/or modules can encounter mechanical loading stresses during high winds. As another example, during a lamination step in a PV laminate manufacturing process, a PV string can encounter thermal expansion stresses. The interconnect joints disclosed herein can mitigate negative impacts (e.g. low quality, poor performance, reduced lifetime) of these stresses. Compared to other metallic (e.g. solder) joints, the disclosed types and configurations of adhesive bonding regions provide PV interconnect joints with the ability to decouple stresses more effectively. FIG. 9 depicts a stress event on a shingled PV module 900. Shingled PV module 900 comprises PV cells 902 connected by interconnect joints 930 to form shingled cell string 904. A mechanical load 980 applied to cell string 904 can result in forces generally depicted at 980' which can deform interconnect joints 930.

Figure 10:
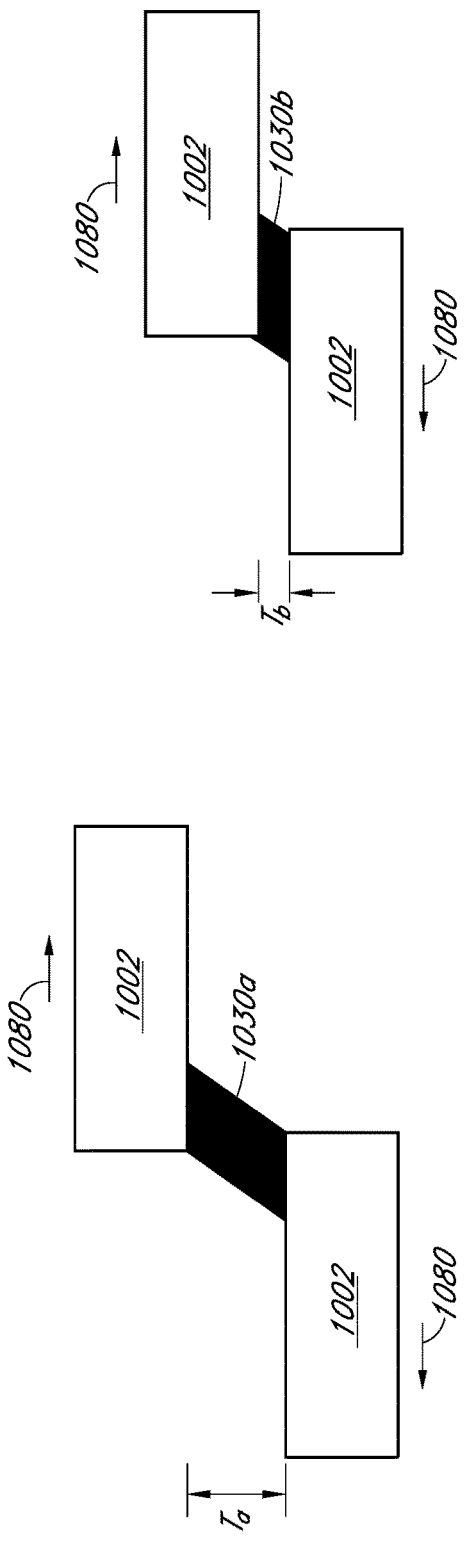
FIG. 10 illustrates an interconnect joint according to an embodiment.

FIG. 10 depicts a magnified view of interconnect joints during a stress event, for example such as application of a mechanical load as illustrated in FIG. 9. In FIG. 10, interconnect joint 1030 coupling shingled PV cells 1002 encounters opposing mechanical forces generally depicted at 1080. Interconnect joint 1030a has a greater bond line thickness $T_a$ than the bond line thickness $T_b$ of interconnect joint 1030b. Compared to interconnect joint 1030b, the thicker bond line $T_a$ of interconnect joint 1030a is more able to dissipate stresses and decouple stresses between adjacent cells, thereby mitigating adverse impact of the stress. Not to be bound by any particular theory, but the degree of decoupling of stresses between adjacent cells is a function of the thickness of the interconnect joint and mechanical properties of the adhesive materials. For example, a thicker and softer interconnect joint would allow greater degree of decoupling leading to enhanced stress dissipation. In an embodiment, the bond line thickness is greater than 10 µm.

Figure 11:
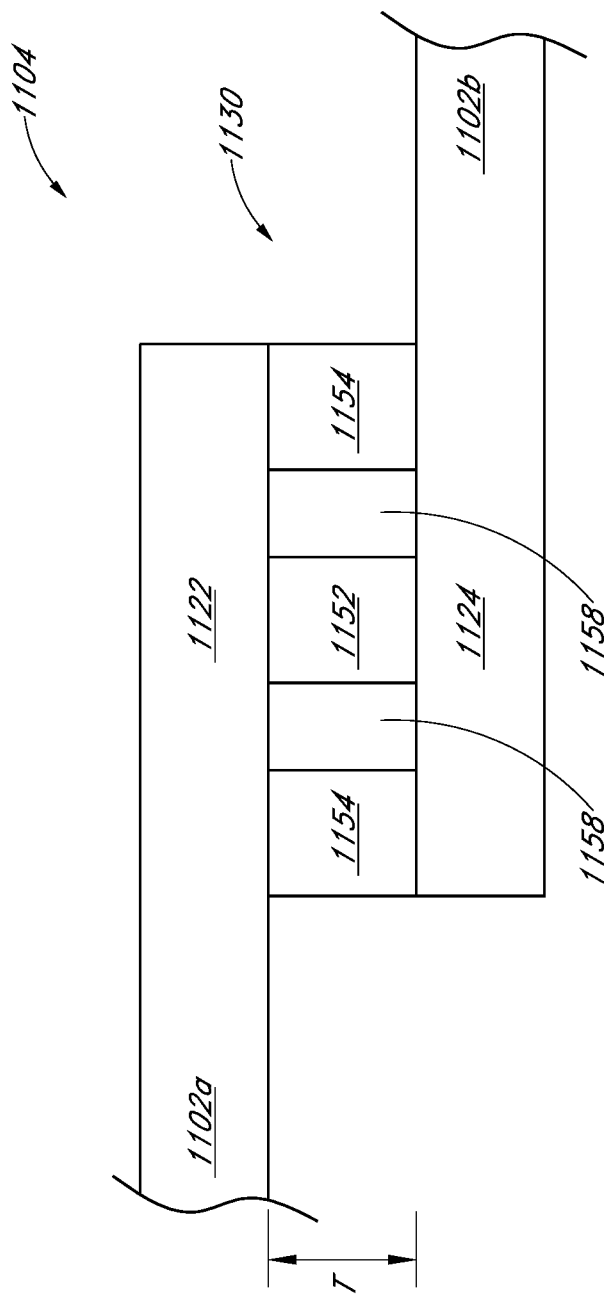
FIG. 11 illustrates a flowchart representation of a method for manufacturing a PV module, according to some embodiments.

In some embodiments, an interconnect joint comprises at least one spacer for maintaining a bond line thickness. FIG. 11 depicts a cross-sectional view of a portion of a shingled PV module cell string 1104 comprising PV cells individually labeled 1102a and 1102b. A first terminal 1122 of PV cell 1102a overlaps the second terminal 1124 of PV cell 1102b to form interconnect joint 1130. The interconnect joint 1130 defines an interconnect bond line having a bond line thickness T. The interconnect joint 1130 comprises a central adhesive bonding region of the first type 1152 substantially surrounded by spacers 1158 and adhesive bonding regions of the second type 1154. In the embodiment depicted in FIG. 11, the spacers 1158 are situated between the adhesive bonding regions of the first and second types 1154, 1156. However, spacers can be arranged in any suitable configuration, for example bonding regions of the second type can substantially surround or encapsulate spacers.

In one embodiment, bonding regions of the first type are electrically conductive and bonding regions of the second type are electrically non-conductive. In another embodiment, the first and second bonding regions are arranged in a predetermined configuration to maximize both the electrical conductivity and mechanical strength of interconnect joints coupling terminals of PV cells. As a non-limiting example, disclosed interconnect joints can have an ultimate tensile strength greater than 1 MPa and an electrical resistance less than $10^{-2}$ ohms.

Other approaches employing conductive adhesives for PV interconnects can be limited in that adhesives can flow from an initial deposition region resulting in a thin bond line. Additionally, the interconnect bond line can be reduced during a manufacturing process e.g. lamination. The disclosed interconnects provide an approach to ensure a minimum bond line is maintained during manufacturing. For example, an adhesive material of a bonding region of the second type can selected to have a greater viscosity than an adhesive material in a bonding region of the first type. In other embodiments, the viscosity of the first and second adhesive materials can differ by less than 10 cP. Not to be bound by any particular theory, but adhesive material viscosity can govern bond line thickness.

In an embodiment, a method is disclosed herein for manufacturing a PV module. The method can comprise the step of providing, or dispensing a first adhesive material in at least one bonding region of a first type. The first adhesive material can be dispensed at a first terminal of a first PV cell to form a bonding region of a first type, for example at operation step 1202 in the flowchart 1200 of FIG. 12. A second adhesive material can be provided, or dispensed in at least one bonding region of a second type. In the exemplary embodiment of FIG. 12, the second adhesive material can be dispensed at the first terminal of the first PV cell at optional step 1204 (optional steps indicated by dashed lines). In an embodiment, the at least one bonding region of the first type and/or the at least one bonding region of the second type being can be dispensed in a predetermined configuration to form an interconnect bond line at the first terminal of the first PV cell. The method for manufacturing a PV module can further comprise a step of aligning a second terminal of a second PV cell with the first terminal of the first PV cell along an interconnect bond line as depicted at step 1206 of FIG. 12. The first terminal of the first PV cell and the second terminal of the second PV cell can be aligned and coupled such that bonding regions of the first and/or second type contact both the first terminal of the first PV cell and the second terminal of the second PV cell. In some embodiments, dispensing a first and/or second adhesive material and aligning terminals of PV cells can be performed during a cell stringing process.

In one embodiment, a method is disclosed for manufacturing a PV module, wherein a stencil is used to provide discrete, or isolated, adhesive bonding regions of the first and/or second types at a terminal of a PV cell. For example, adhesive materials can be applied or dispensed over a stencil comprising a bonding region pattern; wherein the stencil is above a surface of a PV cell. The stencil can comprise openings or slits to create a predetermined bonding region configuration by only allowing the adhesive materials to contact a portion of the surface of the PV cell. As a non-limiting example, the stencil can have a height greater than 10 microns, a height less than 250 microns and/or comprises openings greater than 20 microns in length.

In an embodiment, a method for manufacturing a PV module further comprises at least partially curing the first and/or second adhesive materials. In some embodiments, curing can comprise a heating operation. In one embodiment, the step of curing results in bonding, or coupling terminals of the first and second PV cells forming an interconnect joint and producing a PV cell string. In one embodiment, both the first and second adhesive materials are substantially entirely cured concurrently. In other embodiments, one of the first or second adhesive materials is substantially entirely cured and the other of said first or second adhesive materials is partially cured or kept in an uncured state.

Figure 12:
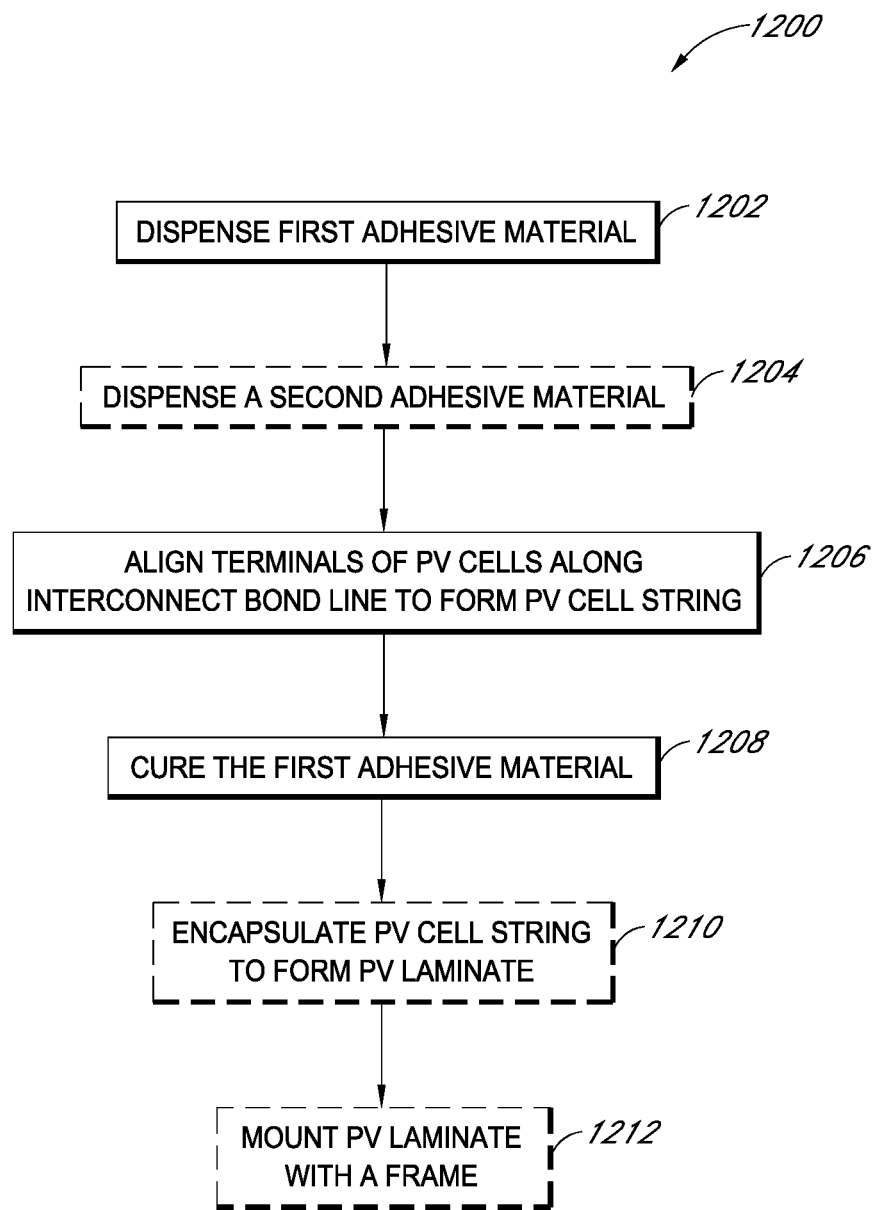
FIG. 12 is a flowchart including various operations in a method for manufacturing a PV module, in accordance with an embodiment of the present disclosure.

The embodiment depicted in FIG. 12 can further comprise the step of encapsulating the PV cell string to form a PV laminate. For example, an encapsulant layer can be provided on a substantially transparent superstrate. A first side of the PV cell string can be positioned on the encapsulant layer and a backsheet can be provided on a second side of the PV cell string. The encapsulant layer can be cured to encapsulate the PV cell string to form a PV laminate comprising the superstrate, the encapsulated PV cell string, and the backsheet. In some embodiments, the bonding region of the second type comprises an encapsulant material. In one embodiment, the bond line thickness is greater than 1 µm subsequent to the step of curing the encapsulant layer. In FIG. 12, the PV laminate can be mounted with a frame to form a PV module at step 1212.

In one embodiment, bonding regions of the first type can bond terminals of PV cells to form a PV cell string during a cell stringing process. For example, the electrically conductive bonding regions of the first type can be at least partially cured. The PV cell string comprising at least partially cured bonding regions of the first type can be encapsulated by an encapsulant material in a lamination or other thermal process. In such an embodiment, the encapsulant material can act as a bonding region of the second type. Lamination e.g. vacuum roll lamination and other thermal processes are typically employed to form protective packages for PV modules and are often performed at temperatures over 100° C.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means- plus- or step-plus-function limitations, unless such a limitation is explicitly recited in a given claim using the phrase(s) "means for" or "step for," respectively.

The invention claimed is:

1. A method for manufacturing a PV device comprising:
providing a PV cell comprising a plurality of discrete contact pads, the plurality of discrete contact pads extending along a first surface of an interconnect bond line, the interconnect bond line along a first peripheral edge of the PV cell;
dispensing a plurality of discrete electrically conductive bonding material regions on each of the plurality of discrete contact pads on the first surface of the interconnect bond line of the PV cell; and
dispensing a plurality of discrete electrically non-conductive bonding material regions on the first surface of the interconnect bond line of along the first peripheral edge of the PV cell in locations between the plurality of discrete contact pads, wherein ones of the plurality of discrete electrically non-conductive bonding material regions are not in contact with ones of the plurality of discrete electrically conductive bonding material regions, and wherein the ones of the plurality of discrete electrically non-conductive bonding material regions are staggered with the ones of the plurality of discrete electrically conductive bonding material regions along the first surface of the interconnect bond line.

2. The method of claim 1, wherein dispensing the plurality of discrete electrically non-conductive bonding material regions comprises dispensing the plurality of discrete electrically non-conductive bonding material regions at alternating locations between the plurality of discrete electrically conductive bonding material regions such that bonding regions of the same type are not directly adjacent to one another.

3. A method for manufacturing a PV device comprising:
providing a PV cell comprising a plurality of discrete contact pads, the plurality of discrete contact pads extending along a first surface of an interconnect bond line, the interconnect bond line along a first peripheral edge of the PV cell;
forming a plurality of discrete electrically conductive bonding material regions on each of the plurality of discrete contact pads on the first surface of the interconnect bond line of the PV cell; and
forming a plurality of discrete electrically non-conductive bonding material regions on the first surface of the interconnect bond line of along the first peripheral edge of the PV cell in locations between the plurality of discrete contact pads, wherein ones of the plurality of discrete electrically non-conductive bonding material regions are not in contact with ones of the plurality of discrete electrically conductive bonding material regions, and wherein the ones of the plurality of discrete electrically non-conductive bonding material regions are staggered with the ones of the plurality of discrete electrically conductive bonding material regions along the first surface of the interconnect bond line.

4. The method of claim 1, wherein forming the plurality of discrete electrically non-conductive bonding material regions comprises forming the plurality of discrete electrically non-conductive bonding material regions at alternating locations between the plurality of discrete electrically conductive bonding material regions such that bonding regions of the same type are not directly adjacent to one another.

\* \* \* \* \*